(12) United States Patent
Yasuda et al.

(10) Patent No.: US 9,917,095 B2
(45) Date of Patent: *Mar. 13, 2018

(54) NONVOLATILE SEMICONDUCTOR STORAGE DEVICE

(71) Applicant: Toshiba Memory Corporation, Minato-ku (JP)

(72) Inventors: Naoki Yasuda, Yokohama (JP); Masaru Kito, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/334,828

(22) Filed: Oct. 26, 2016

(65) Prior Publication Data

US 2017/0053924 A1 Feb. 23, 2017

Related U.S. Application Data

(60) Continuation of application No. 14/944,483, filed on Nov. 18, 2015, now Pat. No. 9,496,278, which is a
(Continued)

(30) Foreign Application Priority Data

Sep. 8, 2011 (JP) ................................. 2011-195846

(51) Int. Cl.
| | |
|---|---|
| H01L 29/792 | (2006.01) |
| H01L 27/1157 | (2017.01) |
| H01L 21/28 | (2006.01) |
| H01L 27/11582 | (2017.01) |
| H01L 29/51 | (2006.01) |
| H01L 27/11568 | (2017.01) |
| H01L 27/11573 | (2017.01) |

(52) U.S. Cl.
CPC .... H01L 27/1157 (2013.01); H01L 21/28282 (2013.01); H01L 27/11568 (2013.01);
(Continued)

(58) Field of Classification Search
CPC ........... H01L 27/1157; H01L 27/11582; H01L 27/11573; H01L 21/28282
See application file for complete search history.

(56) References Cited

U.S. PATENT DOCUMENTS

| | | | |
|---|---|---|---|
| 7,781,824 | B2 | 8/2010 | Yasuda |
| 8,154,072 | B2 | 4/2012 | Koike et al. |

(Continued)

FOREIGN PATENT DOCUMENTS

| | | |
|---|---|---|
| JP | 2009-1465954 | 7/2009 |
| JP | 2009-231373 | 10/2009 |
| JP | 2010-231373 | 7/2010 |

*Primary Examiner* — Dung Le
(74) *Attorney, Agent, or Firm* — Oblon, McClelland, Maier & Neustadt, L.L.P.

(57) ABSTRACT

A nonvolatile semiconductor storage device having a control gate formed on a semiconductor substrate and including a cylindrical through hole. A block insulating film, a charge storage film, a tunnel insulating film, and a semiconductor layer are formed on a side surface of the control gate inside the through hole. The tunnel insulating film includes a first insulating film having $SiO_2$ as a base material and containing an element that lowers a band gap of the base material by being added. A density and a density gradient of the element monotonously increase from the semiconductor layer toward the charge storage film.

11 Claims, 12 Drawing Sheets

Related U.S. Application Data continuation of application No. 14/606,267, filed on Jan. 27, 2015, now Pat. No. 9,224,875, which is a continuation of application No. 14/157,162, filed on Jan. 16, 2014, now Pat. No. 8,963,232, which is a division of application No. 13/428,111, filed on Mar. 23, 2012, now Pat. No. 8,674,430.

(52) U.S. Cl.
 CPC .. *H01L 27/11573* (2013.01); *H01L 27/11582* (2013.01); *H01L 29/511* (2013.01); *H01L 29/513* (2013.01); *H01L 29/517* (2013.01); *H01L 29/518* (2013.01); *H01L 29/792* (2013.01); *H01L 29/7926* (2013.01)

(56) References Cited

U.S. PATENT DOCUMENTS

| | | | |
|---|---|---|---|
| 9,224,875 | B2 | 12/2015 | Yasuda |
| 9,496,278 | B2 * | 11/2016 | Yasuda ............ H01L 21/28282 |
| 2010/0006923 | A1 | 1/2010 | Fujitsuka et al. |
| 2011/0215333 | A1 | 9/2011 | Aoyama et al. |
| 2011/0303969 | A1 | 12/2011 | Kai et al. |
| 2012/0012920 | A1 | 1/2012 | Shin et al. |
| 2017/0053924 | A1 * | 2/2017 | Yasuda ............... H01L 27/1157 |

\* cited by examiner

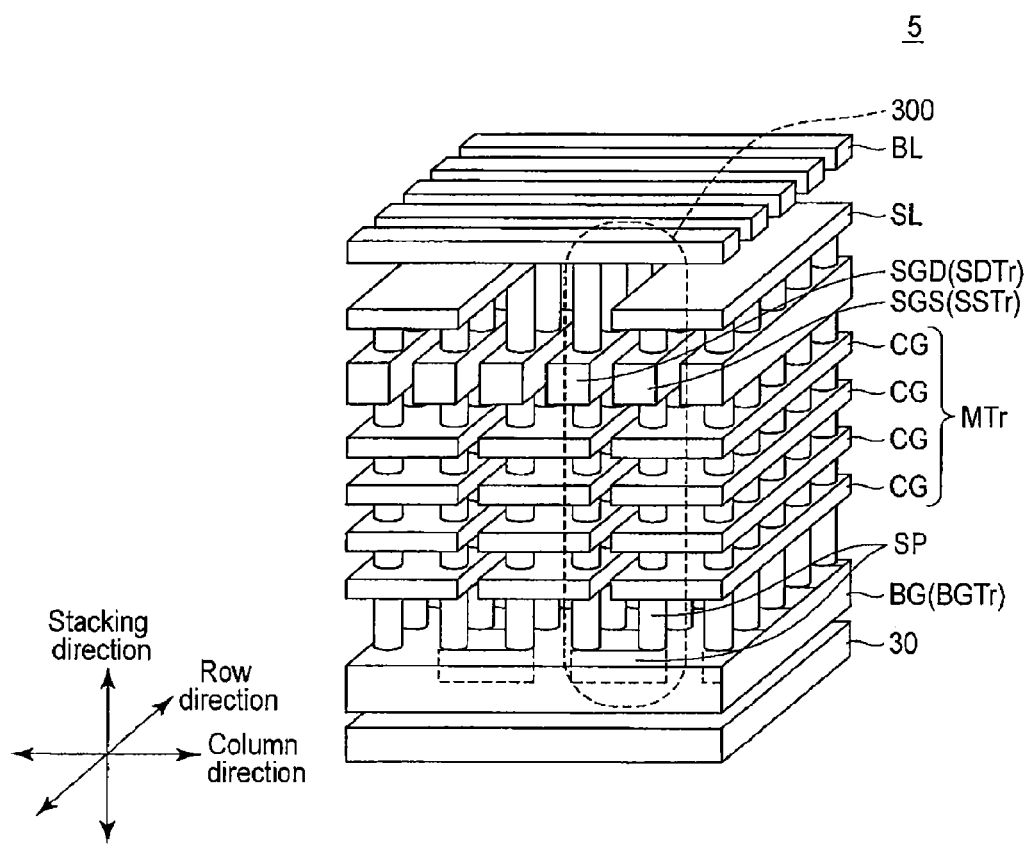
F I G. 2

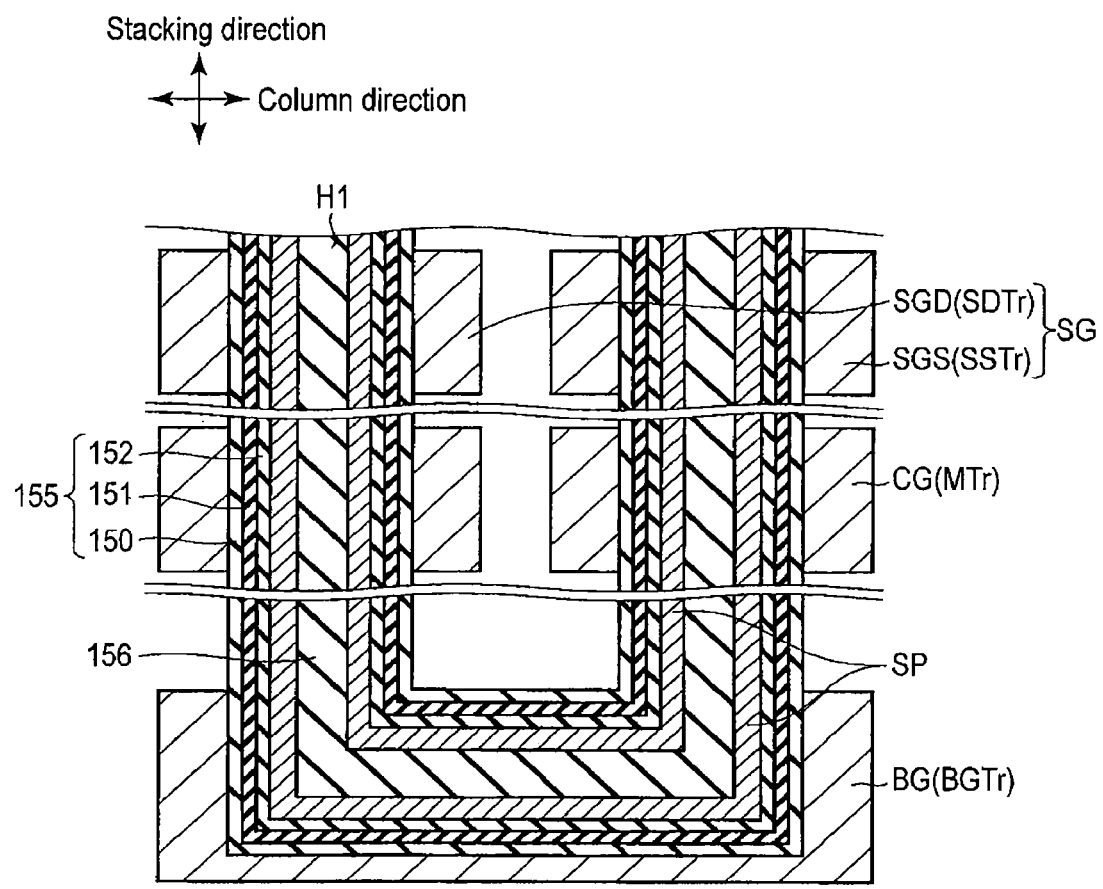
F I G. 3

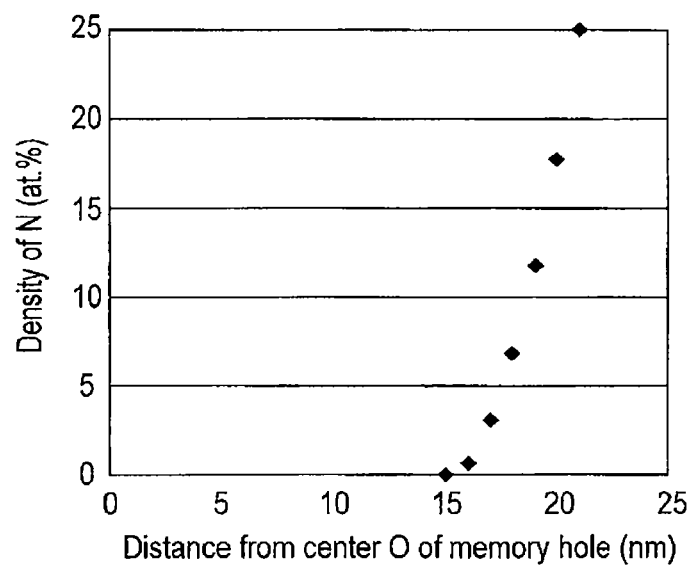
F I G. 5
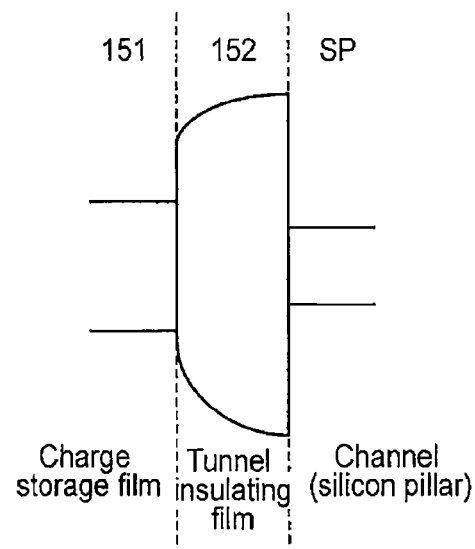
F I G. 6

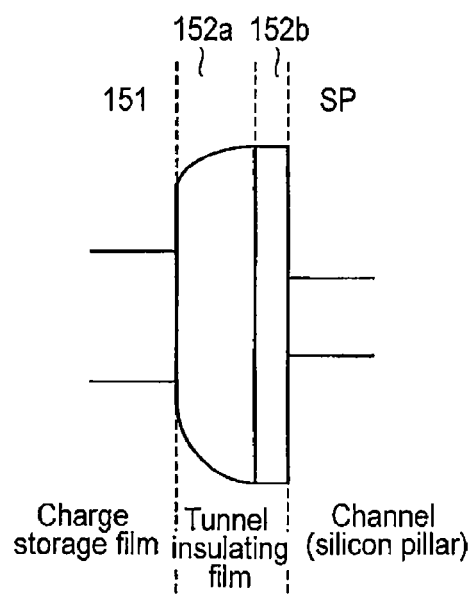
F I G. 12

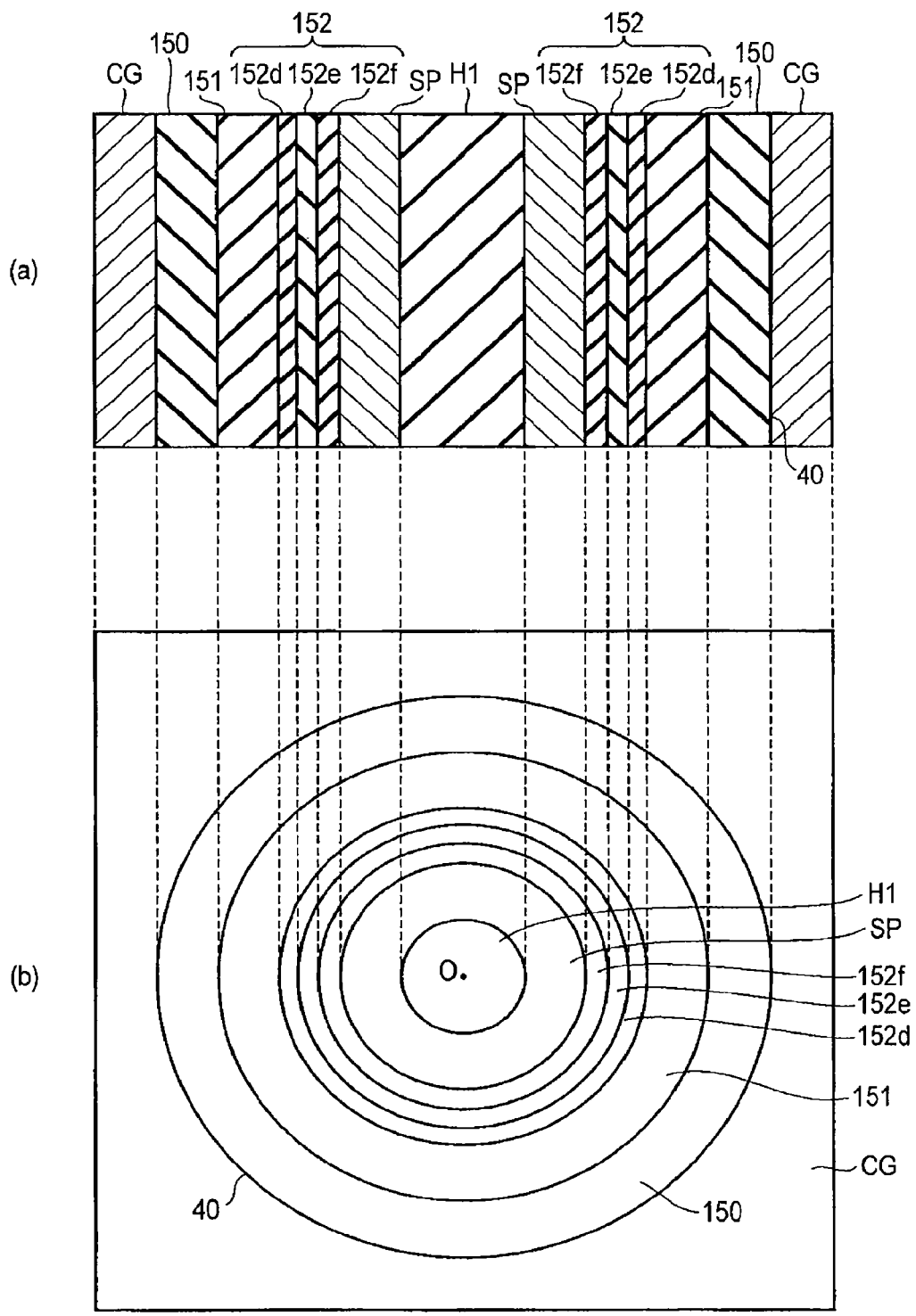
F I G. 13

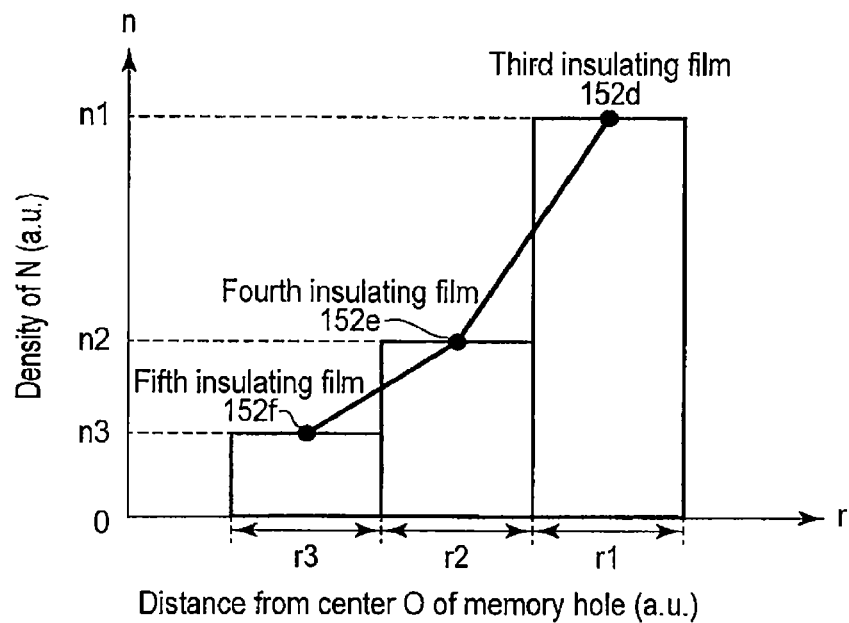
F I G. 14
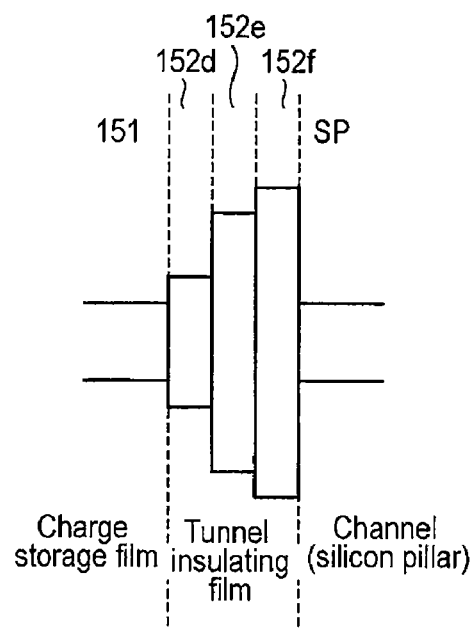
F I G. 15

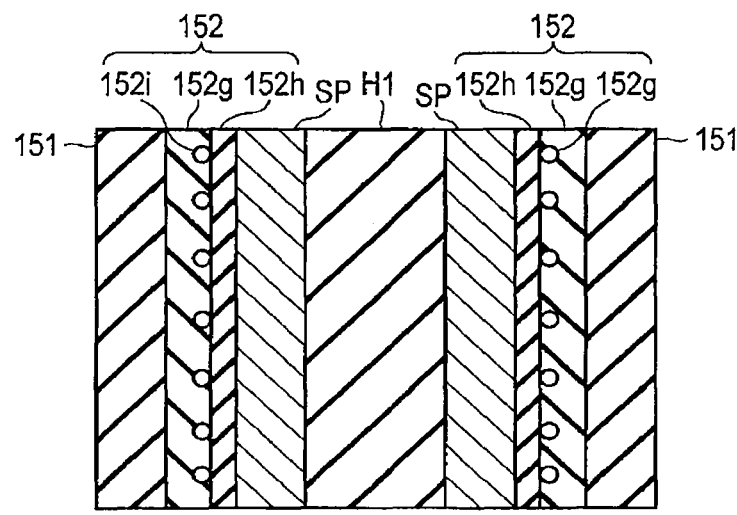
F I G. 16
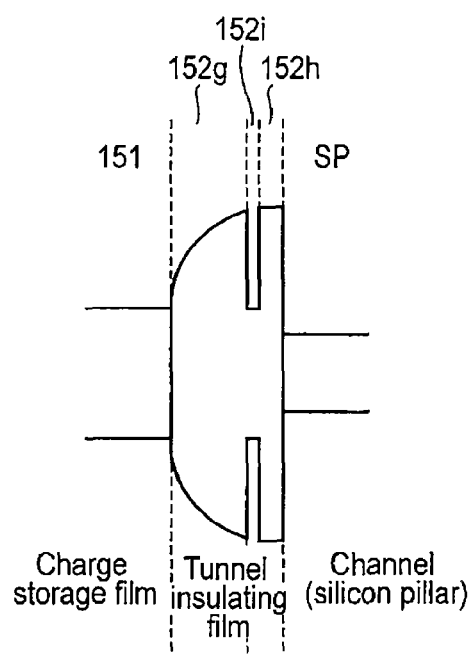
F I G. 17

NONVOLATILE SEMICONDUCTOR STORAGE DEVICE

CROSS-REFERENCE TO RELATED APPLICATIONS

This application is a continuation of and claims the benefit of priority under 35 U.S.C. § 120 from U.S. Ser. No. 14/944,483 filed Nov. 18, 2015 (now U.S. Pat. No. 9,496,278 issued Nov. 15, 2016), which is a continuation of U.S. Ser. No. 14/606,267 filed Jan. 27, 2015 (now U.S. Pat. No. 9,224,875 issued Dec. 29, 2015), which is a continuation of U.S. Ser. No. 14/157,162 filed Jan. 16, 2014 (now U.S. Pat. No. 8,963,232 issued Feb. 24, 2015), which is a division of U.S. Ser. No. 13/428,111 filed Mar. 23, 2012 (now U.S. Pat. No. 8,674,430 issued Mar. 18, 2014), and claims the benefit of priority under 35 U.S.C. § 119 from Japanese Patent Application No. 2011-195846 filed Sep. 8, 2011, the entire contents of each of which are incorporated herein by reference.

FIELD

Embodiments described herein relate generally to a nonvolatile semiconductor storage device.

BACKGROUND

For example, a structure in which an OTP (onetime-programmable) element is sandwiched between multilayer interconnections and a structure in which a plurality of layers of NAND flash memory is formed by repeating epitaxial growth of a silicon film have been proposed as technologies to realize higher densities of memory without relying on lithography. However, these structures have a problem of an increasing number of layers and an increasing number of times of lithography. Thus, a three-dimensional lamination-type vertical memory is proposed.

In a three-dimensional memory, a cylindrical hole (memory hole) is opened collectively in a plurality of electrodes laminated on a semiconductor substrate, a memory film is formed on an inner wall of the hole, and then a polysilicon film (silicon pillar) is formed inside the hole. Accordingly, a memory string serially connected in a laminating direction and formed from a plurality of MONOS memory cells can be formed collectively.

In a MONOS memory cell, a challenge is to improve data retaining (charge retaining) characteristics. Particularly in data retaining after repeating write/erase operations, the distribution of threshold voltage in the memory cell spreads, which may make data discrimination difficult. This applies not only to plane MONOS memory cells, but also to cylindrical MONOS memory cells. Particularly in cylindrical MONOS memory cells, the magnitude of electric field varies in the diameter direction and a solution of data retaining in consideration of different electric fields is needed.

BRIEF DESCRIPTION OF THE DRAWINGS

FIG. 2 is a perspective view showing a memory cell array in FIG. 1;

FIG. 3 is a sectional view enlarging a NAND string in FIG. 2;

FIG. 5 is a graph showing the distribution of an N density of the MONOS memory cell according to the first embodiment;

FIG. 6 is a diagram showing an energy band of the MONOS memory cell according to the first embodiment;

FIG. 12 is a diagram showing the energy band of the MONOS memory cell according to the third embodiment;

FIG. 13 is a sectional view and a plan view respectively showing a MONOS memory cell according to a fourth embodiment;

FIG. 14 is a graph showing the distribution of the N density of the MONOS memory cell according to the fourth embodiment;

FIG. 15 is a diagram showing the energy band of the MONOS memory cell according to the fourth embodiment;

FIG. 16 is a sectional view showing a MONOS memory cell according to a fifth embodiment; and FIG. 17 is a diagram showing the energy band of the MONOS memory cell according to the fifth embodiment.

DETAILED DESCRIPTION

Figure 1:
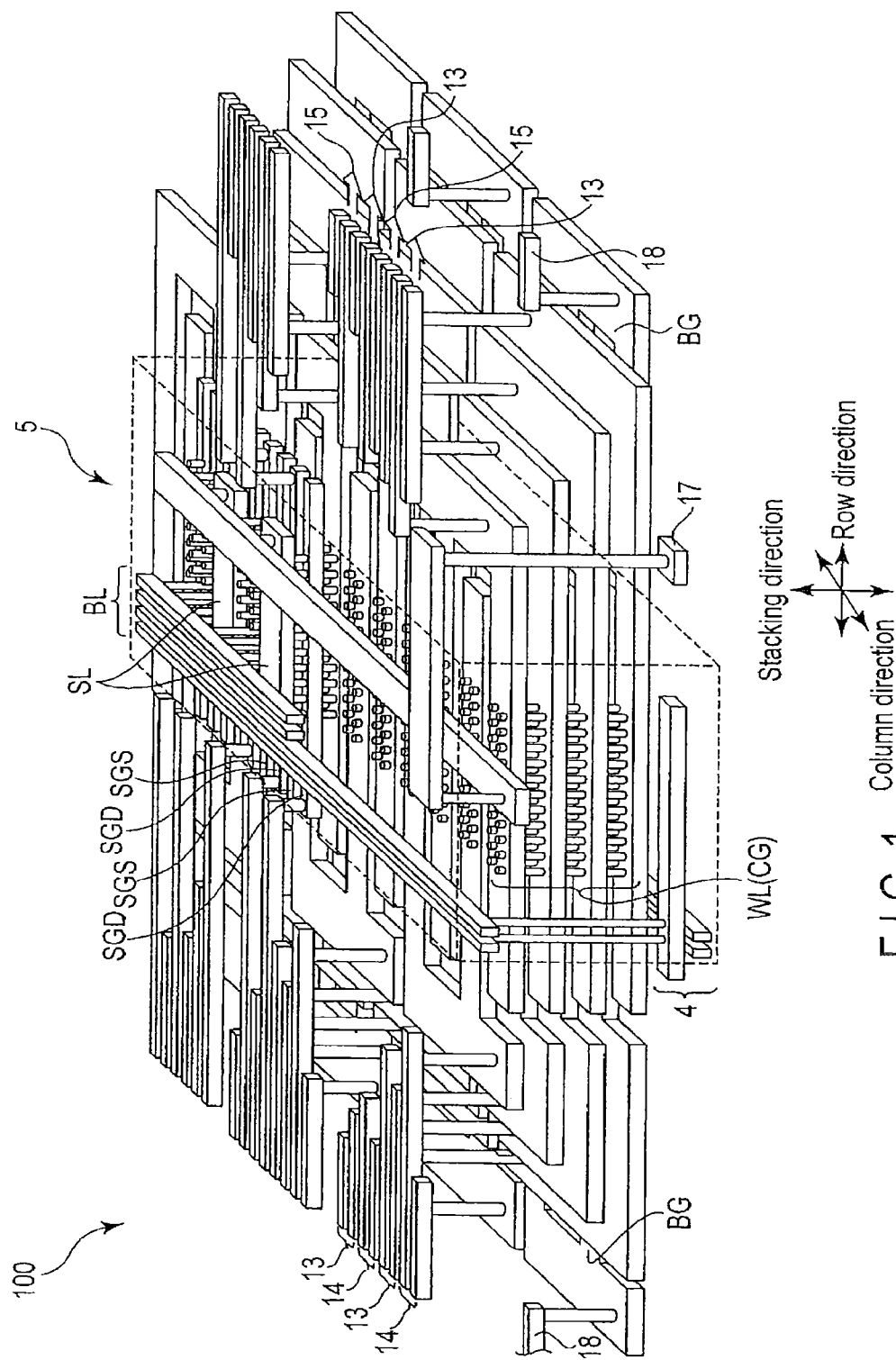
FIG. 1 is a perspective view showing an overall configuration example of a nonvolatile semiconductor storage device according to each embodiment.
Figure 4:
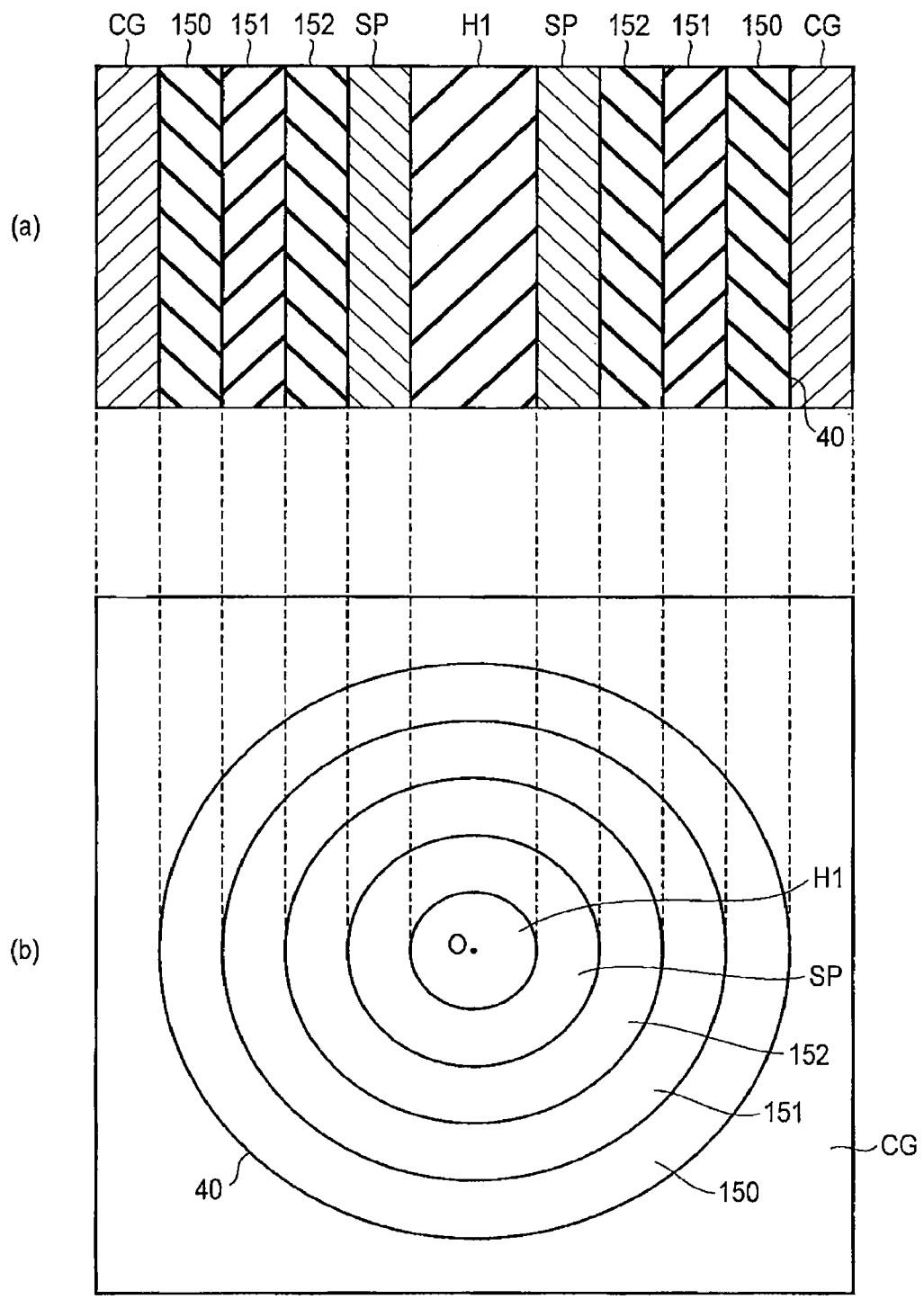
FIG. 4 is a sectional view and a plan view respectively showing a MONOS memory cell according to a first embodiment.
Figure 7:
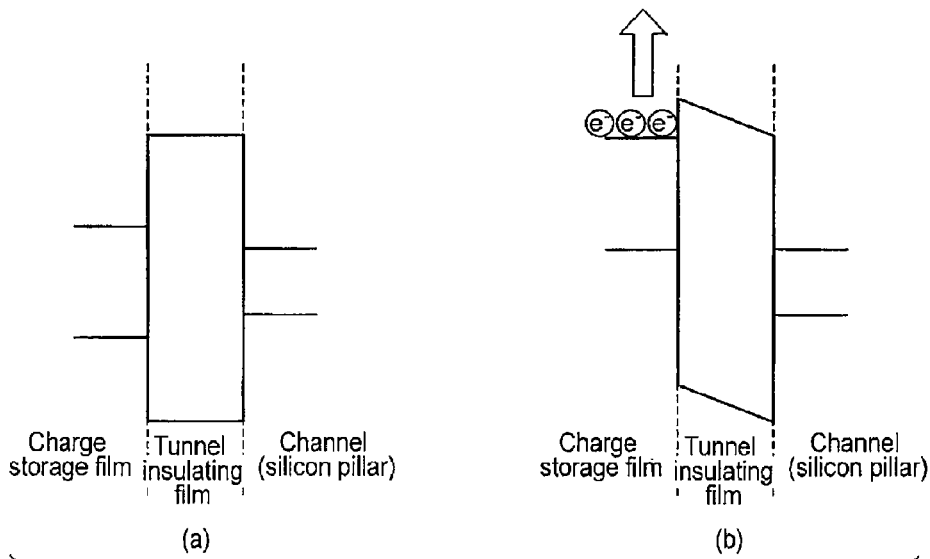
FIG. 7 is diagrams showing a comparative example of band modulation by charge retaining of the MONOS memory cell according to the first embodiment.
Figure 8:
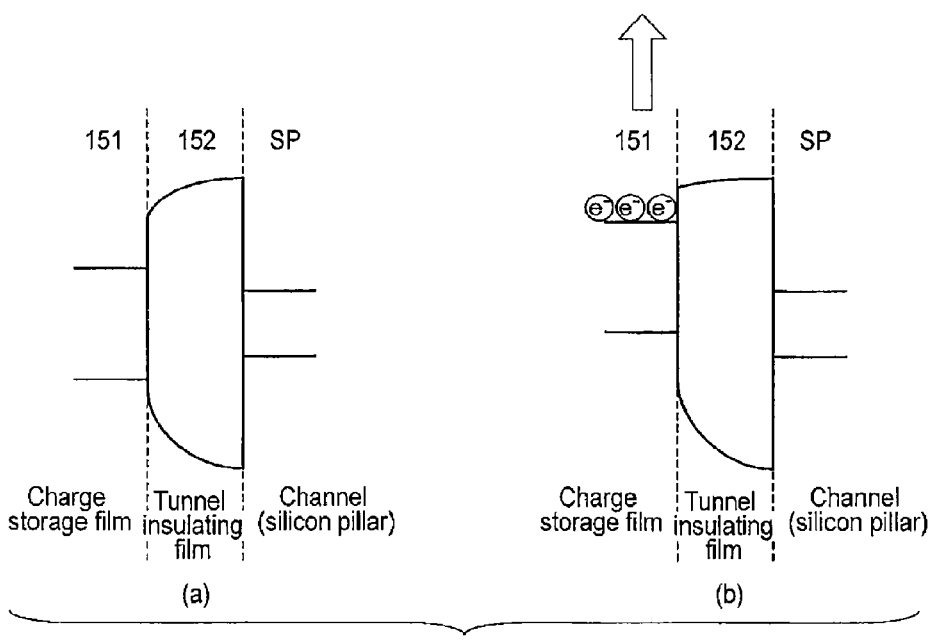
FIG. 8 is diagrams showing the band modulation by charge retaining of the MONOS memory cell according to the first embodiment.

In general, according to one embodiment, a nonvolatile semiconductor storage device comprises a semiconductor substrate; a control gate; a block insulating film; a charge storage film; a tunnel insulating film, and a semiconductor layer. The control gate is formed on the semiconductor substrate and includes a cylindrical through hole extending from a top surface to a bottom surface thereof. The block insulating film is formed on a side surface of the control gate inside the through hole. The charge storage film is formed on the side surface of the block insulating film inside the through hole. The tunnel insulating film is formed on a side surface of the charge storage film inside the through hole. The semiconductor layer is formed on a side surface of the tunnel insulating film inside the through hole. The tunnel insulating film comprises a first insulating film having $SiO_2$ as a base material and containing an element that lowers a band gap of the base material by being added. A density and a density gradient of the element monotonously increase from the semiconductor layer toward the charge storage film.

The present embodiment will be described below with reference to drawings. The same reference numerals are attached to the same elements. A duplicate description may be provided if necessary.

<Configuration Example>

A configuration example of a nonvolatile semiconductor storage device according to each embodiment will be described using FIGS. 1, 2, and 3.

FIG. 1 is a perspective view showing an overall configuration example of a nonvolatile semiconductor storage device according to each embodiment.

As shown in FIG. 1, a nonvolatile semiconductor storage device 100 includes a memory cell array 5, a plurality of word line driving circuits 13, a plurality of source-side select gate line driving circuits 14, a plurality of drain-side select gate driving circuits 15, a sense amplifier 16, a plurality of source line driving circuits 17, and a plurality of back gate transistor driving circuits 18.

In the memory cell array 5, a plurality of word lines WL (control gates CG), a plurality of bit lines BL, a plurality of source line SL, a plurality of back gates BG, a plurality of source-side select gates SGS, and a plurality of drain-side select gates SGD are provided. In the memory cell array 5, a memory cell transistor MTr that stores data is arranged in each intersection position of the plurality of laminated word lines WL and a silicon pillar SP in a U shape described later. FIG. 1 shows an example in which four layers of the word lines WL are laminated, but the present embodiment is not limited to this example.

The word line driving circuit 13 is connected to the word line WL to control the voltage applied to the word line WL. Wires connecting the word line driving circuits 13 and the word lines WL are all formed in the wiring layers at the same level, but the present embodiment is not limited to this example and may be formed in wiring layers of different levels.

The source-side select gate line driving circuit 14 is connected to the source-side select gate SGS to control the voltage applied to the source-side select gate SGS.

The drain-side select gate driving circuit 15 is connected to the drain-side select gate SGD to control the voltage applied to the drain-side select gate SGD.

The sense amplifier 16 is connected to the bit line BL to amplify a potential read from the memory cell transistor MTr. A bit line driving circuit (not shown) controls the voltage applied to the bit line BL.

The source line driving circuit 17 is connected to the source line SL to control the voltage applied to the source line SL. The source line driving circuit 17 is connected to all the source lines SL, but the present embodiment is not limited to this example and one source line driving circuit 17 may be provided each source line SL.

The back gate driving circuit 18 is connected to the back gate BG to control the voltage applied to the back gate BG.

FIG. 2 is a perspective view showing the memory cell array 5 in FIG. 1 and shows the structure of a NAND string (memory cell string) 300. FIG. 3 is a sectional view enlarging the NAND string 300 in FIG. 2.

As shown in FIG. 2, a plurality of the NAND strings (memory cell strings) 300 formed of the U-shaped silicon pillar (semiconductor layer) SP is arranged on a semiconductor substrate 30 in the memory cell array 5. Each of the memory strings 300 includes a plurality of the memory cell transistors MTr in which a current path is serially formed along the U-shaped silicon pillar SP and two select transistors (a drain-side select transistor SDTr and a source-side select transistor SSTr) formed at both ends thereof.

The plurality of the memory cell transistors MTr is formed in each intersection position of the U-shaped silicon pillar SP and the plurality of the control gates CG and the current path is serially connected along the laminating direction. As shown in FIG. 3, each of the memory cell transistors MTr has a memory film 155 between the U-shaped silicon pillar SP and the control gate CG. The memory film 155 is formed of a tunnel insulating film 152, a charge storage film 151, and a block insulating film 150 formed around the U-shaped silicon pillar SP in this order. That is, each of the memory cell transistors MTr is formed of the U-shaped silicon pillar SP and the tunnel insulating film 152, the charge storage film 151, the block insulating film 150, and the control gate CG formed therearound and has a MONOS structure. The MONOS structure according to the present embodiment will be described in detail later.

The drain-side select transistor SDTr is formed in an intersection position of the U-shaped silicon pillar SP and the drain-side select gate SGD. On the other hand, the source-side select transistor SSTr is formed in an intersection position of the U-shaped silicon pillar SP and the source-side select gate SGS. As shown in FIG. 3, like the memory cell transistor MTr, the drain-side select transistor SDTr and the source-side select transistor SSTr each have a MONOS structure.

As shown in FIG. 2, the drain-side select transistor SDTr and the source-side select transistor SSTr are formed above the plurality of the memory cell transistors MTr. One end (drain) of the source-side select transistor SSTr is connected to one end (source) of the plurality of memory cell transistors and the other end (source) thereof is connected to the source line SL. On the other hand, one end (source) of the drain-side select transistor SDTr is connected to the other end (drain) of the plurality of the memory cell transistors MTr and the other end (drain) is connected to the bit line BL.

The U-shaped silicon pillar SP is formed in a U shape in the cross section in a column direction. The U-shaped silicon pillar SP includes a pair of columnar portions extending in the laminating direction and a pipe portion formed to be able to connect lower ends of the pair of columnar portions. The pipe portion is provided in the back gate BG to form a back gate transistor BGTr. The U-shaped silicon pillar SP is arranged in such a way that the straight line connecting the center axes of the pair of columnar portions is parallel to the column direction. The U-shaped silicon pillar SP is also arranged so as to be a matrix shape in a plane formed from a row direction and the column direction. Further, as shown in FIG. 3, the U-shaped silicon pillar SP includes a hollow H1 filled with an insulating portion 156.

The plurality of control gates CG is laminated above the back gate BG and is arranged so as to be orthogonal to the columnar portions of the U-shaped silicon pillar SP. Each of the control gates CG extends in parallel with the row direction. Each of the control gates CG is formed so as to be shared by two adjacent columnar portions (two columnar portions on the center side) of four columnar portions in the two memory cell strings 300 adjacent in the column direction. As shown in FIG. 1, edges of the plurality of laminated control gates CG are stepwise and a contact is connected to the top surface of each step. The even-numbered control gates CG in the column direction are mutually connected on one end in the row direction and the odd-numbered control gates CG are mutually connected on the other end in the row direction.

The back gate BG is formed on the semiconductor substrate 30 (not shown) via an insulating film. The back gate BG is provided below the lowest control gate CG. The back gate BG is formed by extending two-dimensionally in the row direction and the column direction as if to cover a connecting portion of the U-shaped silicon pillar SP.

The drain-side select gate SGD and the source-side select gate SGS are provided above the highest control gate CG. The drain-side select gate SGD and the source-side select gate SGS extend in the row direction. The drain-side select gate SGD is formed so as to be orthogonal to one of the columnar portions of the U-shaped silicon pillar SP and the source-side select gate SGS is formed so as to be orthogonal to the other of the columnar portions thereof. The drain-side select gate SGD and the source-side select gate SGS are formed in a line-and-space structure by being insulated and separated each other in the column direction.

The source line SL is provided above the source-side select gate SGS. The source line SL is formed so as to be shared by two adjacent columnar portions of four columnar portions in the two memory cell strings 300 adjacent in the column direction. The source line SL extends in the row direction in parallel and is formed as in a line-and-space structure by being insulated and separated in the column direction.

The plurality of bit lines BL is provided above the source line SL. Each of the bit lines BL extends in parallel with the column direction and is formed in a line-and-space structure by being insulated and separated each other in the row direction.

<First Embodiment>

A nonvolatile semiconductor storage device according to the first embodiment will be described using FIGS. 4, 5, 6, 7 and 8.

In the first embodiment, a tunnel insulating film 152 in a memory cell transistor MTr (MONOS memory cell) is formed of $SiO_2$ in an interface on the side of the silicon pillar SP and SiON in the interface on the side of a charge storage film 151. Then, the tunnel insulating film 152 is configured to have an increasing N density therebetween from the side of the silicon pillar SP toward the side of the charge storage film 151. Moreover, the gradient of the N density in the tunnel insulating film 152 is configured to increase from the side of the silicon pillar SP toward the side of the charge storage film 151. Accordingly, the band gap of the tunnel insulating film 152 can be configured to decrease from the side of the silicon pillar SP toward the side of the charge storage film 151, improving charge retaining characteristics. Also by increasing the gradient of the N density from the side of the silicon pillar SP toward the side of the charge storage film 151, the effect of shape in which the electric field decreases from the center toward the outer circumference of the cylindrical MONOS memory cell can be compensated for to realize a uniform tunnel insulating film electric field.

A nonvolatile semiconductor storage device according to the first embodiment will be described in detail below.

[Structure]

First, the structure of a MONOS memory cell according to the first embodiment will be described.

FIGS. 4(a) and 4(b) are a sectional view and a plan view respectively showing a MONOS memory cell according to the first embodiment. More specifically, FIG. 4(a) shows a sectional view of a MONOS memory cell according to the first embodiment and FIG. 4(b) shows a plan view thereof.

As shown in FIGS. 4(a) and 4(b), the MONOS memory cell includes a control gate CG, a block insulating film 150, the charge storage film 151, the tunnel insulating film 152, and the silicon pillar SP.

The control gate CG has a cylindrical memory hole (through hole) 40 extending from the top surface to the bottom surface thereof. In other words, the control gate CG has the memory hole 40 cutting through in the laminating direction.

The block insulating film 150 is formed on the side surface of the control gate CG inside the memory hole 40. The block insulating film 150 is formed of laminated films of, for example, $SiO_2$ (silicon oxide), SiN (silicon nitride), and $SiO_2$ formed from the side surface of the control gate CG in this order. However, the block insulating film 150 is not limited to the above example and may be formed of a single film of $SiO_2$ or SiN.

The charge storage film 151 is formed on the side surface of the block insulating film 150 inside the memory hole 40. The charge storage film 151 is formed of, for example, SiN. However, the charge storage film 151 is not limited to the above example and may be formed of various insulating films, but is formed of a material whose band gap is smaller than the band gap of the tunnel insulating film 152 described later.

The tunnel insulating film 152 is formed on the side surface of the charge storage film 151 inside the memory hole 40. Details of the tunnel insulating film 152 according to the present embodiment will be described later.

The silicon pillar SP is formed on the side surface of the tunnel insulating film 152 inside the memory hole 40. The silicon pillar SP is formed of, for example, polysilicon or amorphous silicon. A hollow H1 is formed inside the silicon pillar SP (in the center portion of the memory hole 40) and is filled with an insulating material. However, the present embodiment is not limited to the above example and the hollow H1 may be formed as a cavity.

The block insulating film 150, the charge storage film 151, the tunnel insulating film 152, and the silicon pillar SP are formed along the cylindrical memory hole 40 and are also formed in a cylindrical shape. In addition, the block insulating film 150, the charge storage film 151, the tunnel insulating film 152, and the silicon pillar SP are formed concentrically around a center O of the memory hole 40.

FIG. 5 is a graph showing the distribution of an N density of the MONOS memory cell according to the first embodiment. The interface between the channel (silicon pillar SP) and the tunnel insulating film 152 is located in a position of a distance of 15 nm from the center O of the memory hole 40. The tunnel insulating film 152 has a thickness of 6 nm. That is, FIG. 5 mainly shows the N density of the tunnel insulating film 152. FIG. 6 is a diagram showing an energy band of the MONOS memory cell according to the first embodiment.

The tunnel insulating film 152 according to the first embodiment is formed of $SiO_2$ in the interface with the channel and formed of SiON (silicon oxynitride) in the interface with the charge storage film 151. The tunnel insulating film 152 is also formed of SiON in which the N density changes continuously therebetween. The tunnel insulating film 152 has Si (silicon) and O (oxygen), that is, $SiO_2$ as the base material. The tunnel insulating film 152 also contains N (nitrogen), which is different from the base material.

N is an element that reduces the band gap of the base material by being added to the tunnel insulating film 152 having $SiO_2$ as the base material thereof. More specifically, in the tunnel insulating film 152, the band gap thereof can be reduced by increasing the N density thereof and the band gap thereof can be increased by reducing the N density thereof. That is, the band gap of the tunnel insulating film 152 changes as a decreasing function of the N density. The rate of change of the band gap of the tunnel insulating film 152 corresponds to the rate of change of the N density.

The base material indicates a main material of the tunnel insulating film 152, but does not simply indicate a material of a large composition ratio. The base material indicates an original material whose band gap (or band offset) is reduced after a different element (here, N) being added.

As shown in FIG. 5, the N density in the tunnel insulating film 152 monotonously increases from the silicon pillar SP (inside the memory hole 40) toward the charge storage film 151 (outside the memory hole 40). That is, the tunnel insulating film 152 is formed of SiON whose N density increases from the channel toward the charge storage film 151. The gradient (if the density of N is n and the distance from the center O of the memory hole 40 is r, the differential coefficient thereof dn/dr) of the N density in the tunnel insulating film 152 monotonously increases from the silicon pillar SP toward the charge storage film 151. That is, the N density in the tunnel insulating film 152 has an increasing rate of change (rate of increase) thereof from the center O of the memory hole 40 toward the outer side. In this case, the N density in the tunnel insulating film 152 and the gradient thereof change continuously from the silicon pillar SP toward the charge storage film 151.

Thus, by introducing an element (N) that is different from the base material of the tunnel insulating film 152 whose base material is $SiO_2$, the band structure of the tunnel insulating film 152 can be modulated. More specifically, as shown in FIG. 6, the tunnel insulating film 152 has a large band gap (or band offset) on the channel side and a small band gap (or band offset) on the side of the charge storage film 151. The band gap (or band offset) in the tunnel insulating film 152 monotonously decreases from the silicon pillar SP toward the charge storage film 151. The absolute value of the gradient of the band gap (or band offset) in the tunnel insulating film 152 monotonously increases from the silicon pillar SP toward the charge storage film 151. In this case, the band gap (or band offset) in the tunnel insulating film 152 changes continuously from the silicon pillar SP toward the charge storage film 151. The band offset in the above description is a conduction band offset or a valence band offset.

The composition ratio of the material (SiON) constituting the tunnel insulating film 152 is represented as $(SiO_2)_x(Si_3N_4)_{1-x}$. More specifically, x is 1 in the interface with the channel and x is 0.75 in the interface with the charge storage film 151. That is, the composition ratio changes in the range of x=0.75 to 1. If x is smaller than 0.75 in the composition ratio, an average coordination number Nav of the tunnel insulating film 152 exceeds 3. If the average coordination number Nav exceeds 3, defects in the film increases rapidly. Thus, x≥0.75 is set for the composition ratio of a material constituting the tunnel insulating film 152 in the present embodiment.

Also as shown in FIG. 6, if N is added to the tunnel insulating film 152 having $SiO_2$ as the base material, the modulation on the valence band side is larger than the modulation on the conduction band side in the energy band. The modulation on the valence band side can contribute to improvement of erase characteristics.

[Manufacturing Method]

Next, the manufacturing method of a MONOS memory cell according to the first embodiment will be described.

First, the cylindrical memory hole 40 is formed in a conductive layer to be the control gate CG so as to reach from the top surface to the bottom surface thereof. Next, the block insulating film 150 is formed on the side surface of the control gate CG inside the memory hole 40. Then, the charge storage film 151 is formed on the side surface of the block insulating film 150 inside the memory hole 40.

Next, the tunnel insulating film 152 is formed on the side surface of the charge storage film 151 inside the memory hole 40. The tunnel insulating film 152 is formed as shown below:

First, a first film formed of SiON is formed on the side surface of the charge storage film 151 inside the memory hole 40 by, for example, the ALD (Atomic Layer Deposition) method. Next, a second film formed of SiON having a lower N density than the first film is formed on the side surface of the first film by, for example, the ALD method. Then, a plurality of films formed of SiON is similarly formed on the side surface of the second film by, for example, the ALD method. In this case, an inner film has a lower N density and a smaller gradient than an outer film. Then, lastly, after a film formed of $SiO_2$ being formed by, for example, the ALD method, annealing is performed sufficiently. Accordingly, N is diffused and the tunnel insulating film 152 in which the N density is continuous and the N density and the gradient thereof monotonously decrease toward the inner side of the memory hole 40 is formed.

Further, the tunnel insulating film 152 is formed as shown below:

First, a film formed of SiN is formed on the side surface of the charge storage film 151 inside the memory hole 40 by, for example, the ALD and the film is oxidized to form a first film formed of SiON. Next, a film formed of SiN is formed on the side surface of the first film by, for example, the ALD and the film is oxidized to form a second film formed of SiON having the N density lower than the N density of the first film. Then, a film formed of SiN is similarly formed on the side surface of the second film by, for example, the ALD and the film is oxidized to form a film formed of SiON and the above process is repeated. In this case, an inner film has a lower N density and a smaller gradient than an outer film. Then, lastly, after a film formed of $SiO_2$ being formed by, for example, the ALD method, annealing is performed sufficiently. Accordingly, N is diffused and the tunnel insulating film 152 in which the N density is continuous and the N density and the gradient thereof monotonously decrease toward the inner side of the memory hole 40 is formed.

Next, the silicon pillar SP is formed on the side surface of the tunnel insulating film 152 inside the memory hole 40. Then, an insulating material is formed on the side surface of the silicon pillar SP inside the memory hole 40 to fill up the center portion thereof to complete a MONOS memory cell.

[Effect]

According to the first embodiment, the tunnel insulating film 152 in a MONOS memory cell is formed of $SiO_2$ in the interface on the side of the silicon pillar SP and formed of SiON in the interface on the side of the charge storage film 151 and the portion therebetween is formed of SiON in which the N density and the gradient of the N density increase (monotonously increase) from the side of the silicon pillar SP toward the side of the charge storage film 151. Accordingly, the band gap (or the band offset) of the tunnel insulating film 152 can be configured to decrease from the side of the silicon pillar SP toward the side of the charge storage film 151. As a result, charge retaining characteristics can be improved. The principle of the band modulation by charge retaining will be described below.

FIGS. 7(a) and 7(b) are diagrams showing a comparative example of band modulation by charge retaining of the MONOS memory cell according to the first embodiment and FIGS. 8(a) and 8(b) are diagrams showing the band modulation by charge retaining of the MONOS memory cell according to the first embodiment.

According to the comparative example, as shown in FIG. 7(a), if no charge (electron) is held in the charge storage film 151, there is no internal electric field (gradient of the band gap) in the tunnel insulating film 152 and the band gap has a constant magnitude in each film. Then, as shown in FIG.

7(b), if a charge is held in the charge storage film 151, band modulation arises due to the charge. More specifically, a barrier to electrons in the conduction band side becomes smaller due to increased band energy of the charge storage film 151 and also a self electric field arises in the band energy of the tunnel insulating film 152 in such a way that electrons are likely to be detrapped. Accordingly, charge retaining characteristics of the charge storage film 151 are degraded.

According to the first embodiment, as shown in FIG. 8(a), by contrast, if no charge is held in the charge storage film 151, an internal electric field arises in the tunnel insulating film 152 and the band gap of the tunnel insulating film 152 decreases from the side of the silicon pillar SP toward the side of the charge storage film 151. Thus, if a charge is held in the charge storage film 151, as shown in FIG. 8(b), even if a self electric field arises in band energy of the tunnel insulating film 152 due to the charge, the self electric field can be mitigated. That is, detrapping of the charge held in the charge storage film 151 can be suppressed.

Also according to the first embodiment, an internal electric field arises in the conduction band side so that electrons are accelerated toward the side of the charge storage film 151. An electric field during writing can thereby be increased, improving write characteristics. Further, an internal electric field arises in the valence band side so that holes are accelerated toward the side of the charge storage film 151. An electric field during erasing can thereby be increased, improving erase characteristics. Particularly, a large internal electric field is generated in the valence band side by adding N to the tunnel insulating film 152. Thus, erase characteristics can further be improved. With improvement in write/erase characteristics, degradation in durability of the memory cell can be suppressed.

Incidentally, an electric field $E=C/\in r$ arises in the diameter direction of the cylinder in a cylindrical MONOS memory cell, where E is the electric field, $\in$ is the dielectric constant, r is the distance from the center O of the memory hole 40, and C is a constant proportional to the amount of charge and inversely proportional to the thickness of the word line WL. That is, the electric field becomes smaller with an increasing distance from the center O of the memory hole 40 in a cylindrical MONOS memory cell for write and erase operations. In other words, the electric field becomes smaller from the center O of the memory hole 40 toward the outer side (shape effect of the cylindrical memory cell).

If the N density is monotonously increased toward the outer side in the diameter direction, the band gap (or the band offset) decreases and thus, an internal electric field can be generated. However, simply increasing the N density may not be able to cover a decrease of the electric field due to the shape effect (increase in distance r) of the cylindrical memory cell and a decrease of the electric field due to an increase in dielectric constant with the introduction of N. That is, in write/erase operations, characteristics thereof cannot be considerably improved simply by monotonously increasing the N density in the tunnel insulating film 152 toward the outer side.

According to the first embodiment, by contrast, not only the N density in the tunnel insulating film 152 is monotonously increased from the side of the silicon pillar SP toward the side of the charge storage film 151, but also the gradient of the N density is monotonously increased. Accordingly, the internal electric field in the side of the charge storage film 151 can further be increased. As a result, an influence of the shape effect of the cylindrical memory cell can be corrected, write/erase characteristics can be improved, and a self electric field due to stored charges can sufficiently be mitigated so that satisfactory data retaining characteristics can be obtained.

<Second Embodiment>

A nonvolatile semiconductor storage device according to the secondary embodiment will be described using FIGS. 9 and 10.

In the secondary embodiment, a tunnel insulating film 152 in a memory cell transistor MTr (MONOS memory cell) is formed of $SiO_2$ in the interface on the side of a silicon pillar SP and $Al_2O_3$ in the interface on the side of a charge storage film 151. Then, the tunnel insulating film 152 is configured to have an increasing Al density and an increasing gradient thereof therebetween from the side of the silicon pillar SP toward the side of the charge storage film 151. That is, the second embodiment is different from the first embodiment in that, instead of the N density, the Al density is changed.

A nonvolatile semiconductor storage device according to the second embodiment will be described in detail below. The same aspects in the second embodiment as in the first embodiment are omitted and the description mainly focuses on differences.

[Structure]

First, the structure of a MONOS memory cell according to the second embodiment will be described.

Figure 9:
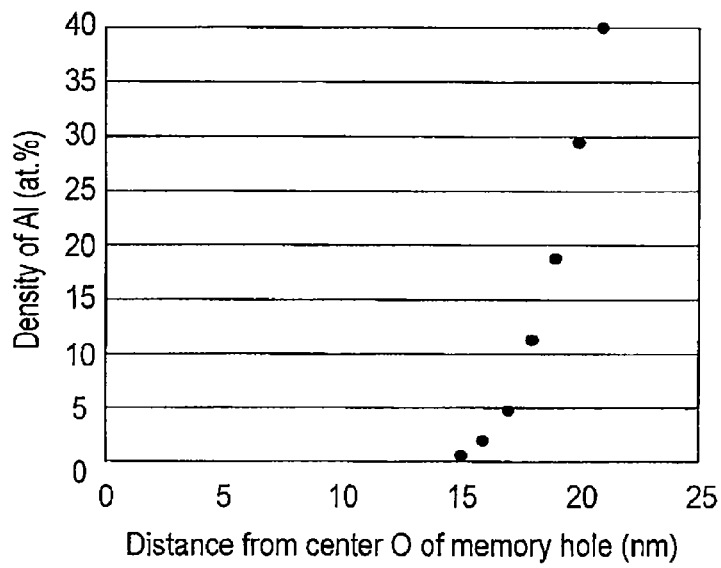
FIG. 9 is a graph showing the distribution of an Al density of a MONOS memory cell according to a second embodiment.

FIG. 9 is a graph showing the distribution of an Al (aluminum) density of a MONOS memory cell according to the second embodiment. The interface between the channel (silicon pillar SP) and the tunnel insulating film 152 is located in a position of a distance of 15 nm from a center O of a memory hole 40. The tunnel insulating film 152 has a thickness of 6 nm. That is, FIG. 9 mainly shows the Al density of the tunnel insulating film 152. FIG. 10 is a diagram showing an energy band of the MONOS memory cell according to the second embodiment.

The tunnel insulating film 152 according to the second embodiment is formed of $SiO_2$ in the interface on the side of the channel and formed of $Al_2O_3$ (alumina) in the interface on the charge storage film 151. Then, the tunnel insulating film 152 is formed of AlSiO (aluminum silicate) in which the Al density changes continuously therebetween. The tunnel insulating film 152 has Si and O, that is, $SiO_2$ as the base material. The tunnel insulating film 152 also contains the element Al, which is different from the base material.

Al is an element that reduces the band gap of the base material by being added to the tunnel insulating film 152 having $SiO_2$ as the base material thereof. More specifically, in the tunnel insulating film 152, the band gap (or the band offset) thereof can be reduced by increasing the Al density thereof and the band gap (or the band offset) thereof can be increased by reducing the Al density thereof. That is, the band gap (or the band offset) of the tunnel insulating film 152 changes as a decreasing function of the Al density. The rate of change of the band gap (or the band offset) of the tunnel insulating film 152 corresponds to the rate of change of the Al density.

The base material indicates a main material, but does not simply indicate a material of a large composition ratio. The base material indicates an original material whose band gap (or band offset) is reduced after a different element (here, Al) being added.

As shown in FIG. 9, the Al density in the tunnel insulating film 152 monotonously increases from the side of the silicon pillar SP toward the side of the charge storage film 151. The gradient (if the density of Al is n and the distance from the center O of the memory hole 40 is r, the differential coefficient thereof dn/dr) of the Al density in the tunnel insulating film 152 monotonously increases from the side of the silicon pillar SP toward the side of the charge storage film 151. That is, the Al density in the tunnel insulating film 152 has an increasing rate of change (rate of increase) thereof from the center O of the memory hole 40 toward the outer side. In this case, the Al density in the tunnel insulating film 152 and the gradient thereof change continuously from the side of the silicon pillar SP toward the side of the charge storage film 151.

Thus, by introducing an element (Al) that is different from the base material of the tunnel insulating film 152 whose base material is $SiO_2$, the band structure of the tunnel insulating film 152 can be modulated. More specifically, as shown in FIG. 10, the tunnel insulating film 152 has a large band gap (or band offset) on the channel side and a small band gap (or band offset) on the side of the charge storage film 151. The band gap (or band offset) in the tunnel insulating film 152 monotonously decreases from the side of the silicon pillar SP toward the side of the charge storage film 151. The absolute value of the gradient of the band gap (or band offset) in the tunnel insulating film 152 monotonously increases/decreases from the side of the silicon pillar SP toward the side of the charge storage film 151. In this case, the band gap (or band offset) in the tunnel insulating film 152 changes continuously from the side of the silicon pillar SP toward the side of the charge storage film 151.

The composition ratio of the material (AlSiO) constituting the tunnel insulating film 152 is represented as $(SiO_2)_x (Al_2O_3)_{1-x}$. More specifically, x is 1 in the interface with the channel and x is 0 in the interface with the charge storage film 151. That is, the composition ratio changes in the range of x=0 to 1.

Figure 10:
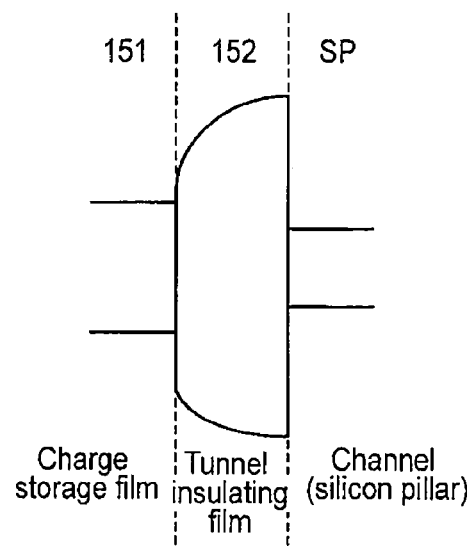
FIG. 10 is a diagram showing the energy band of the MONOS memory cell according to the second embodiment.

Also as shown in FIG. 10, if Al is added to the tunnel insulating film 152 having $SiO_2$ as the base material, the modulation on the valence band side is larger than the modulation on the conduction band side in the energy band. The modulation on the valence band side can contribute to improvement of charge retaining characteristics and write characteristics.

[Manufacturing Method]

Next, the manufacturing method of a MONOS memory cell according to the second embodiment will be described.

First, the cylindrical memory hole 40 is formed in a conductive layer to be the control gate CG so as to reach from the top surface to the bottom surface thereof. Next, a block insulating film 150 is formed on the side surface of the control gate CG inside the memory hole 40. Then, the charge storage film 151 is formed on the side surface of the block insulating film 150 inside the memory hole 40.

Next, the tunnel insulating film 152 is formed on the side surface of the charge storage film 151 inside the memory hole 40. The tunnel insulating film 152 is formed by the method of forming aluminum silicate using the ALD method. More specifically, the tunnel insulating film 152 is formed as follows:

First, a first film formed of $AL_2O_3$ is formed on the side surface of the charge storage film 151 inside the memory hole 40 by, for example, the ALD (Atomic Layer Deposition) method. Next, a second film formed of $SiO_2$ is formed on the side surface of the first film by, for example, the ALD method. Then, similarly a film formed of $AL_2O_3$ and a film formed of $SiO_2$ are alternately formed on the side surface of the second film by, for example, the ALD method.

The ALD method is a deposition method capable of forming an atomic layer in units of layer. Thus, the number of layers of $Al_2O_3$ inside the memory hole 40 increases toward the outer side and decreases toward the inner side.

On the other hand, the number of layers of $SiO_2$ inside the memory hole 40 decreases toward to the outer side and increases toward the inner side. Then, lastly, after a film formed of $SiO_2$ being formed by, for example, the ALD method, annealing is performed sufficiently. Accordingly, Al is diffused and the tunnel insulating film 152 in which the Al density is continuous and the Al density and the gradient thereof monotonously decrease toward the inner side of the memory hole 40 is formed.

Next, the silicon pillar SP is formed on the side surface of the tunnel insulating film 152 inside the memory hole 40. Then, an insulating material is formed on the side surface of the silicon pillar SP inside the memory hole 40 to fill up the center portion of the memory hole 40 to complete a MONOS memory cell.

[Effect]

According to the second embodiment, the same effect as in the first embodiment can be achieved. That is, improvement of charge retaining characteristics and improvement of write/erase characteristics can be sought.

In addition, according to the second embodiment, the tunnel insulating film 152 is formed of $SiO_2$ in the interface on the side of the silicon pillar SP and formed of $Al_2O_3$ in the interface on the side of the charge storage film 151 and a portion therebetween is formed of AlSiO in which the Al density and the gradient thereof increase (monotonously increase) from the side of the silicon pillar SP toward the side of the charge storage film 151. Accordingly, the band gap (or the band offset) of the tunnel insulating film 152 can be configured to decrease from the side of the silicon pillar SP toward the side of the charge storage film 151. Because a larger internal electric field arises in the conduction band than in the valence band, write characteristics can further be improved.

Incidentally, the element added to the tunnel insulating film 152 is not limited to Al and, for example, Hf (hafnium) may also be added. That is, the tunnel insulating film 152 may be formed of $SiO_2$ in the interface on the side of the channel and formed of $HfO_2$ in the interface on the side of the charge storage film 151 and a portion therebetween may be formed of HfSiO (hafnium silicate) in which the Hf density increases (monotonously increases) from the silicon pillar SP toward the charge storage film 151.

<Third Embodiment>

Figure 11:
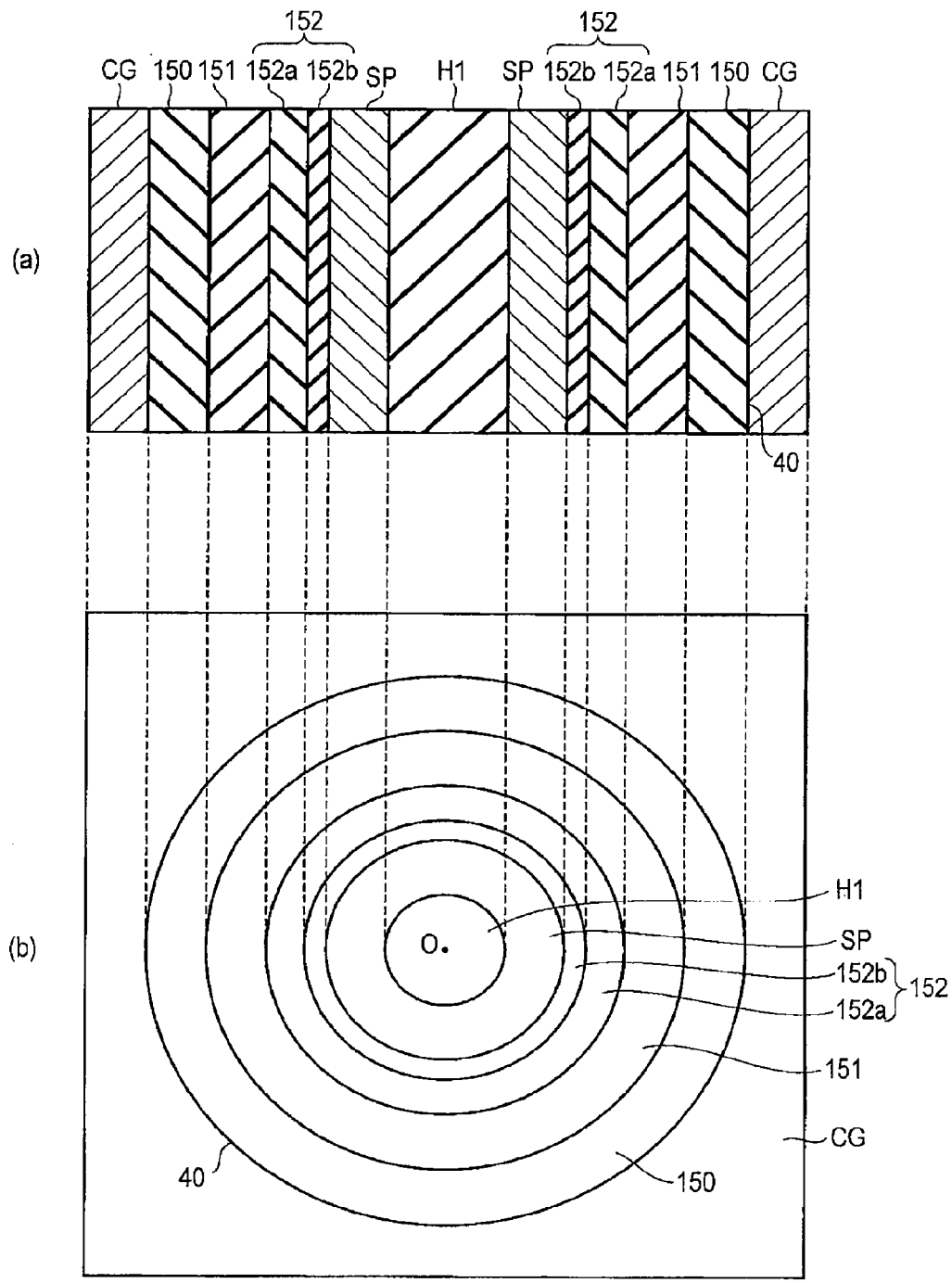
FIG. 11 is a sectional view and a plan view respectively showing a MONOS memory cell according to a third embodiment.

A nonvolatile semiconductor storage device according to the third embodiment will be described using FIGS. 11 and 12.

In the third embodiment, a tunnel insulating film 152 in a memory cell transistor MTr (MONOS memory cell) is formed of a first insulating film 152a containing SiON on the side of a charge storage film 151 and a second insulating film 152b containing $SiO_2$ on the side of a silicon pillar SP. More specifically, the first insulating film 152a is configured to have an increasing N density from the side of the silicon pillar SP toward the side of the charge storage film 151 and the second insulating film 152b is configured by $SiO_2$ whose composition ratio is constant. That is, the third embodiment is different from the first embodiment in that the tunnel insulating film 152 is formed of the first insulating film 152a containing SiON and the second insulating film 152b containing $SiO_2$.

A nonvolatile semiconductor storage device according to the third embodiment will be described in detail below. The same aspects in the third embodiment as in the first embodiment are omitted and the description mainly focuses on differences.

[Structure]

First, the structure of a MONOS memory cell according to the third embodiment will be described.

FIGS. 11(a) and 11(b) are a sectional view and a plan view respectively showing a MONOS memory cell according to the third embodiment. More specifically, FIG. 11(a) shows a sectional view of a MONOS memory cell according to the third embodiment and FIG. 11(b) shows a plan view thereof.

As shown in FIGS. 11(a) and 11(b), the tunnel insulating film 152 is formed of the first insulating film 152a and the second insulating film 152b in the third embodiment.

The first insulating film 152a is formed on the side surface of the charge storage film 151 inside a memory hole 40. The first insulating film 152a has a structure similar to the structure of the tunnel insulating film 152 in the first embodiment. That is, the first insulating film 152a is formed of $SiO_2$ in the interface with the second insulating film 152b described later and formed of SiON in the interface with the charge storage film 151. The portion therebetween is formed of SiON in which the N density changes continuously. The first insulating film 152a has Si and O, that is, $SiO_2$ as the base material. The first insulating film 152a also contains N, which is different from the base material.

The second insulating film 152b is formed on the side surface of the first insulating film 152a inside the memory hole 40. The second insulating film 152b is formed of $SiO_2$. The composition ratio of the second insulating film 152b is constant. The second insulating film 152b has a thickness of 1 nm or more. The silicon pillar SP is formed on the side surface of the second insulating film 152b. In other words, the second insulating film 152b is formed between the first insulating film 152a and the silicon pillar SP.

FIG. 12 is a diagram showing the energy band of the MONOS memory cell according to the third embodiment.

As shown in FIG. 12, the band gap in the first insulating film 152a monotonously decreases from the side of the silicon pillar SP toward the side of the charge storage film 151. The absolute value of the gradient of the band gap in the first insulating film 152a monotonously increases from the side of the silicon pillar SP toward the side of the charge storage film 151. In this case, the band gap in the first insulating film 152a changes continuously from the side of the silicon pillar SP toward the side of the charge storage film 151.

The composition ratio of the material (SiON) constituting the first insulating film 152a is represented as $(SiO_2)_x (Si_3N_4)_{1-x}$. More specifically, x is 1 in the interface with the second insulating film 152b and x is 0.75 in the interface with the charge storage film 151. That is, the composition ratio changes in the range of x=0.75 to 1.

On the other hand, the second insulating film 152b has a constant magnitude. This is because the second insulating film 152b does not contain N, is formed of $SiO_2$, and is formed in a constant composition ratio. The band gap in the second insulating film 152b has a magnitude comparable to the magnitude of the band gap of edges on the side of the silicon pillar SP (inside the memory hole 40) of the first insulating film 152a. Thus, the band gap of the first insulating film 152a and the band gap of the second insulating film 152b are continuously in contact. In other words, the first insulating film 152a and the second insulating film 152b are in contact with the continuous composition ratio.

[Manufacturing Method]

Next, the manufacturing method of a MONOS memory cell according to the third embodiment will be described.

First, the cylindrical memory hole 40 is formed in a conductive layer to be the control gate CG so as to reach from the top surface to the bottom surface thereof. Next, a block insulating film 150 is formed on the side surface of the control gate CG inside the memory hole 40. Then, the charge storage film 151 is formed on the side surface of the block insulating film 150 inside the memory hole 40.

Next, the first insulating film 152a is formed on the side surface of the charge storage film 151 inside the memory hole 40. The first insulating film 152a is formed by a method almost the same as the method of forming the tunnel insulating film 152 in the first embodiment.

Then, the second insulating film 152b is formed on the side surface of the first insulating film 152a inside the memory hole 40. The second insulating film 152b formed of $SiO_2$ is formed by forming the first insulating film 152a formed of SiON and, for example, annealing edges thereof (inside the memory hole 40) with oxygen.

The second insulating film 152b is also formed by forming the first insulating film 152a formed of SiON, then forming polycrystalline silicon and, subsequently annealing the back side of the polycrystalline silicon (inside the memory hole 40). That is, the front side of the polycrystalline silicon is oxidized by supplying oxygen via polycrystalline silicon to be the silicon pillar SP, forming the second insulating film 152b between the first insulating film 152a and the silicon pillar SP.

Then, the center portion of the memory hole 40 is filled up by a normal method to complete a MONOS memory cell.

[Effect]

According to the third embodiment, the same effect as in the first embodiment can be achieved. That is, improvement of charge retaining characteristics and improvement of write/erase characteristics can be sought.

According to the third embodiment, the tunnel insulating film 152 is formed of the first insulating film 152a containing SiON on the side of the charge storage film 151 and the second insulating film 152b containing $SiO_2$ on the side of the silicon pillar SP. That is, there is a region (the second insulating film 152b) in which N is not present between the channel and the first insulating film 152a. If N is present near the channel, mobility of charges in the channel is degraded. According to the third embodiment, mobility of charges in the channel can be enhanced by forming the second insulating film 152b having no N in the interface with the channel.

The first insulating film 152a is not limited to a structure similar to the structure of the tunnel insulating film 152 in the first embodiment and may have a structure similar to the structure of the tunnel insulating film 152 in the second embodiment. That is, the first insulating film 152a may be formed of $SiO_2$ in the interface on the side of the second insulating film 152b and formed of $Al_2O_3$ in the interface on the side of the charge storage film 151 and the portion therebetween may be formed of AlSiO in which the Al density and the gradient thereof increase (monotonously increase) from the side of the second insulating film 152b toward the side of the charge storage film 151.

<Fourth Embodiment>

A nonvolatile semiconductor storage device according to the fourth embodiment will be described using FIGS. 13, 14 and 15.

The fourth embodiment is a modification of the third embodiment and an example in which a tunnel insulating film 152 in a memory cell transistor MTr (MONOS memory cell) is formed of a third insulating film 152d containing SiON, a fourth insulating film 152e containing SiON having a lower N density than the N density of the third insulating film 152d, and a fifth insulating film 152f containing $SiO_2$ laminated in the above order from the side of a charge storage film 151. The fourth embodiment is different from the third embodiment in that the third insulating film 152d, the fourth insulating film 152e, and the fifth insulating film 152f constituting the tunnel insulating film 152 are films having discontinuous composition ratios, instead of films having continuous composition ratios.

A nonvolatile semiconductor storage device according to the fourth embodiment will be described in detail below. The same aspects in the fourth embodiment as in the third embodiment are omitted and the description mainly focuses on differences.

[Structure]

First, the structure of a MONOS memory cell according to the fourth embodiment will be described.

FIGS. 13(a) and 13(b) are a sectional view and a plan view respectively showing a MONOS memory cell according to the fourth embodiment. More specifically, FIG. 13(a) shows a sectional view of a MONOS memory cell according to the fourth embodiment and FIG. 13(b) shows a plan view thereof.

As shown in FIGS. 13(a) and 13(b), the tunnel insulating film 152 is formed of the third insulating film 152d, the fourth insulating film 152e, and the fifth insulating film 152f.

The third insulating film 152d is formed on the side surface of the charge storage film 151 inside a memory hole 40. The third insulating film 152d is formed of SiON. The third insulating film 152d has Si and O, that is, $SiO_2$ as a base material and also contains N, which is different from the base material. The N density in the third insulating film 152d is, for example, 18 at. %. The third insulating film 152d has a constant composition ratio and has a thickness of, for example, 2 nm.

The fourth insulating film 152e is formed on the side surface of the third insulating film 152d inside the memory hole 40. The third insulating film 152d is formed of SiON. The fourth insulating film 152e has Si and O, that is, $SiO_2$ as a base material and also contains N, which is different from the base material. The N density in the fourth insulating film 152e is lower than the N density in the third insulating film 152d and is, for example, 7 at. %. The fourth insulating film 152e has a constant composition ratio and has a thickness of, for example, 2 nm.

The fifth insulating film 152f is formed on the side surface of the fourth insulating film 152e inside the memory hole 40. The fifth insulating film 152f is formed of $SiO_2$. The fifth insulating film 152f has a constant composition ratio. The fifth insulating film 152f has a thickness of, for example, 2 nm. A silicon pillar SP is formed on the side surface of the fifth insulating film 152f. The fifth insulating film 152f has Si and O, that is, $SiO_2$ as a base material and also contains N, which is different from the base material.

Incidentally, the relationship of N density in the third insulating film 152d, the fourth insulating film 152e, and the fifth insulating film 152f is not limited to the above example and only needs to be as follows.

FIG. 14 is a graph showing the distribution of the N density of the MONOS memory cell according to the fourth embodiment.

As shown in FIG. 14, a case when the N densities of the third insulating film 152d, the fourth insulating film 152e, and the fifth insulating film 152f are $n_1$, $n_2$, and $n_3$ and the thicknesses of the third insulating film 152d, the fourth insulating film 152e, and the fifth insulating film 152f are $r_1$, $r_2$, and $r_3$ respectively will be considered.

In this case, the N densities satisfy the relationship $n_1 > n_2 > n_3$. Gradients of the N densities satisfy the relationship $(n_1-n_2)/(r_1+r_2) > (n_2-n_3)/(r_2+r_3)$. That is, the N density in the tunnel insulating film 152 increases with an increasing distance from the center O of the memory hole 40. The difference (gradient) of the N densities between adjacent films also increases with an increasing distance from the center O of the memory hole 40. More specifically, the difference in N density between the fourth insulating film 152e and the third insulating film 152d positioned on the outer side is larger than the difference in N density between the fifth insulating film 152f and the fourth insulating film 152e positioned on the inner side.

Incidentally, if $r_1=r_2=r_3$ (thicknesses are all equal) and $n_3=0$, the equation $n_1 > 2 \times n_2$ holds.

If there are four or more insulating films, instead of three, conditions of the N densities and N density gradients hold. More specifically, a case when the N densities of insulating films formed in the order from the outer side (charge storage film 151 side) toward the inner side (silicon pillar SP side) are $n_1, n_2, \ldots, n_i$ (i is an integer and $i \geq 3$) and the thicknesses thereof are $r_1, r_2, \ldots, r_i$ will be considered. In this case, the N densities satisfy the relationship $n_1 > n_2 \ldots > n_i$. Gradients of the N densities satisfy the relationship $(n_1-n_2)/(r_1+r_2) > (n_2-n_3)/(r_2+r_3) \ldots > (n_{i-1}-n_i)/(r_{i-1}+r_i)$.

FIG. 15 is a diagram showing the energy band of the MONOS memory cell according to the fourth embodiment.

As shown in FIG. 15, the band gap of the third insulating film 152d has a constant magnitude. This is because the third insulating film 152d is formed of SiON having a constant composition ratio.

The band gap of the fourth insulating film 152e has a constant magnitude and is larger than the band gap of the third insulating film 152d. This is because the fourth insulating film 152e is formed of SiON having a constant composition ratio and the N density thereof is lower than the N density of the third insulating film 152d.

The band gap of the fifth insulating film 152f has a constant magnitude. This is because the fifth insulating film 152f does not contain N, is formed of $SiO_2$, and is formed with a constant composition ratio. The fifth insulating film 152f has a larger band gap than the third insulating film 152d and the fourth insulating film 152e because the fifth insulating film 152f does not contain N.

As shown in FIG. 15, the band gap increases in the order of the third insulating film 152d, the fourth insulating film 152e, and the fifth insulating film 152f. In other words, the tunnel insulating film is formed of laminated films with an increasing band gap from the charge storage film 151 toward the silicon pillar SP. Moreover, the band gaps of the third insulating film 152d, the fourth insulating film 152e, and the fifth insulating film 152f are stepwise in each interface. That is, as shown in FIG. 14, composition ratios of the third insulating film 152d, the fourth insulating film 152e, and the fifth insulating film 152f are stepwise and discontinuous in each interface.

[Manufacturing Method]

Next, the manufacturing method of a MONOS memory cell according to the fourth embodiment will be described.

First, the cylindrical memory hole 40 is formed in a conductive layer to be the control gate CG so as to reach from the top surface to the bottom surface thereof. Next, a block insulating film 150 is formed on the side surface of the control gate CG inside the memory hole 40. Then, the charge storage film 151 is formed on the side surface of the block insulating film 150 inside the memory hole 40.

Next, the third insulating film 152d formed of SiON is formed on the side surface of the charge storage film 151 inside the memory hole 40 by, for example, the ALD method. Next, the fourth insulating film 152e having a lower N density than the third insulating film 152d and formed of SiON is formed on the side surface of the third insulating film 152d inside the memory hole 40 by, for example, the ALD method. Next, the fifth insulating film 152f formed of SiO₂ is formed on the side surface of the fourth insulating film 152e inside the memory hole 40 by, for example, the ALD method. Accordingly, the tunnel insulating film 152 formed of laminated films with discontinuous composition ratios is formed.

Next, the silicon pillar SP is formed on the side surface of the tunnel insulating film 152 inside the memory hole 40. Then, an insulating material is formed on the side surface of the silicon pillar SP inside the memory hole 40 to fill up the center portion of the memory hole 40 to complete a MONOS memory cell.

[Effect]

According to the fourth embodiment, the same effect as in the third embodiment can be achieved. That is, improvement of charge retaining characteristics and improvement of write/erase characteristics can be sought and also mobility of charges in the channel can be enhanced.

According to the fourth embodiment, the tunnel insulating film 152 is formed of the third insulating film 152d containing SiON, the fourth insulating film 152e containing SiON having a lower N density than the N density of the third insulating film 152d, and the fifth insulating film 152f containing SiO₂ laminated in the above order from the side of the charge storage film 151. The third insulating film 152d, the fourth insulating film 152e, and the fifth insulating film 152f are each films having a constant composition ratio. In addition, the composition ratio in each interface is discontinuous. That is, according to the manufacturing method in the fourth embodiment, the tunnel insulating film 152 is formed by performing the ALD method using gas types of three patterns. A switching sequence of the ALD method occurs less frequently. Moreover, there is no need of subsequent annealing. Accordingly, processes can be made simpler and the processing time can be reduced.

In the fourth embodiment, a case when the tunnel insulating film 152 has three layers is described, but the tunnel insulating film 152 may have four layers or more. The thickness of each of the third insulating film 152d, the fourth insulating film 152e, and the fifth insulating film 152f is set to 2 nm, but may be changed when appropriate if the total thickness of the tunnel insulating film 152 is about 6 nm.

<Fifth Embodiment>

A nonvolatile semiconductor storage device according to the fifth embodiment will be described using FIGS. 16 and 17.

The fifth embodiment is a modification of the third embodiment and an example in which a tunnel insulating film 152 in a memory cell transistor MTr (MONOS memory cell) is formed of a sixth insulating film 152g containing SiON on the side of a charge storage film 151 and a seventh insulating film 152h containing SiO₂ on the side of a silicon pillar SP and an Si microcrystal 152i is contained near an interface thereof.

A nonvolatile semiconductor storage device according to the fifth embodiment will be described in detail below. The same aspects in the fifth embodiment as in the third embodiment are omitted and the description mainly focuses on differences.

[Structure]

First, the structure of a MONOS memory cell according to the fifth embodiment will be described.

FIG. 16 is a sectional view showing a MONOS memory cell according to the fifth embodiment.

As shown in FIG. 16, a tunnel insulating film 152 includes the sixth insulating film 152g, the seventh insulating film 152h, and the Si microcrystal 152i in the fifth embodiment.

The sixth insulating film 152g is formed on the side surface of the charge storage film 151 inside a memory hole 40. The sixth insulating film 152g has a structure similar to the structure of the first insulating film 152a in the third embodiment.

The seventh insulating film 152h is formed on the side surface of the sixth insulating film 152g inside a memory hole 40. The seventh insulating film 152h has a structure similar to the structure of the second insulating film 152b in the third embodiment.

The Si microcrystal 152i is contained near the interface between the sixth insulating film 152g and the seventh insulating film 152h in the tunnel insulating film 152. The existing density of the Si microcrystal 152i is desirably constant, but may be different from region to region. In FIG. 16, the Si microcrystal 152i is formed only near the interface between the sixth insulating film 152g and the seventh insulating film 152h, but may be present inside the seventh insulating film 152h. The Si microcrystal 152i is also called an Si dot or an Si nano-crystal.

FIG. 17 is a diagram showing the energy band of the MONOS memory cell according to the fifth embodiment.

As shown in FIG. 17, the band gap in the sixth insulating film 152g monotonously decreases from the side of the silicon pillar SP toward the side of the charge storage film 151. The absolute value of the gradient of the band gap in the sixth insulating film 152g monotonously increases from the side of the silicon pillar SP toward the side of the charge storage film 151. In this case, the band gap in the sixth insulating film 152g changes continuously from the side of the silicon pillar SP toward the side of the charge storage film 151.

On the other hand, the band gap in the seventh insulating film 152h has a constant magnitude. This is because the second insulating film 152b does not contain N, is formed of SiO₂, and is formed with a constant composition ratio.

If N is added to the sixth insulating film 152g having SiO₂ as a base material, the modulation on the valence band side is larger than the modulation on the conduction band side in the energy band.

In the fifth embodiment, the Si microcrystal 152i is added to the sixth insulating film 152g having SiO₂ as a base material. In this case, as shown in FIG. 17, an influence of the introduction of the Si microcrystal 152i becomes evident in the energy band and the probability of tunneling of electrons in the conduction band side during writing increases. Further, the probability of tunneling of holes in the valence band side during erasing increases.

That is, not only improvement of erase characteristics, but also further improvement of charge retaining characteristics and write characteristics can be sought.

[Manufacturing Method]

Next, the manufacturing method of a MONOS memory cell according to the fifth embodiment will be described.

First, the cylindrical memory hole 40 is formed in a conductive layer to be the control gate CG so as to reach from the top surface to the bottom surface thereof. Next, a block insulating film 150 is formed on the side surface of the control gate CG inside the memory hole 40. Then, the charge storage film 151 is formed on the side surface of the block insulating film 150 inside the memory hole 40.

Next, the sixth insulating film 152g is formed on the side surface of the charge storage film 151 inside the memory hole 40. The sixth insulating film 152g is formed by a method similar to the method of forming the first insulating film 152a in the third embodiment.

Next, a silicon thin film is formed on the side surface of the sixth insulating film 152g inside the memory hole 40. Then, RTA (Rapid Thermal Anneal) processing is performed, for example, at 900 to 1000°. The RTA processing is performed at high temperature for a short time to form the Si microcrystal 152i. In this manner, the Si microcrystal 152i is formed on the surface of the sixth insulating film 152g.

Then, the seventh insulating film 152h is formed on the side surface of the sixth insulating film 152g on which the Si microcrystal 152i is formed. The seventh insulating film 152h is formed by a method similar to the method of forming the second insulating film 152b in the third embodiment.

Then, the center portion of the memory hole 40 is filled up by a normal method to complete a MONOS memory cell.
[Effect]

According to the fifth embodiment, the same effect as in the third embodiment can be achieved. That is, improvement of charge retaining characteristics and improvement of write/erase characteristics can be sought and also mobility of charges in the channel can be enhanced because the insulating film near the channel is formed of $SiO_2$.

According to the fifth embodiment, the tunnel insulating film 152 is formed of the sixth insulating film 152g containing SiON on the side of the charge storage film 151 and the seventh insulating film 152h containing $SiO_2$ on the side of the silicon pillar SP and the Si microcrystal 152i is contained near an interface thereof. By adding the Si microcrystal 152i to the tunnel insulating film 152, the probability of electron tunneling particularly in the conduction band side increases, improving write characteristics. That is, not only N that causes a large internal electric field in the valence band side, but also the Si microcrystal 152i that improves write characteristics is added to the tunnel insulating film 152. Thus, not only improvement of erase characteristics by adding N, but also further improvement of charge retaining characteristics and write characteristics can be sought.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
    a stacked structural unit including a plurality of electrode films stacked in a first direction;
    a silicon pillar piercing the stacked structural unit;
    a block insulating film provided between the electrode films and the silicon pillar;
    a charge storage film provided between the block insulating film and the silicon pillar; and
    a tunnel insulating film provided between the charge storage film and the silicon pillar,
    wherein the tunnel insulating film includes silicon oxide as a base material and includes an element,
    the tunnel insulating film includes a first point, a second point, a third point, and a fourth point in this order from the silicon pillar toward the charge storage film, and
    a first density of the element at the first point is lower than a second density of the element at the second point, the second density of the element is equal to a third density of the element at the third point, and the second density of the element is lower than a fourth density of the element at the fourth point.

2. The device of claim 1, wherein the tunnel insulating film further includes a fifth point between the first point and the second point, and the first density of the element is equal to a fifth density of the element at the fifth point.

3. The device of claim 1, wherein the tunnel insulating film further includes a sixth point between the third point and the fourth point, and the fourth density of the element is equal to a sixth density of the element at the sixth point.

4. The device of claim 1, wherein the first point is located at an interface between the tunnel insulating film and the silicon pillar and the fourth point is located at an interface between the tunnel insulating film and the charge storage film.

5. The device of claim 1, wherein the element of the tunnel insulating film is nitrogen.

6. The device of claim 1, wherein the element of the tunnel insulating film is one of aluminum and hafnium.

7. The device of claim 1, further comprising:
    a first insulating film provided between the tunnel insulating film and the silicon pillar, the first insulating film being containing silicon oxide.

8. The device of claim 1, wherein a density gradient between the first point and the second point is smaller than a density gradient between the third point and the fourth point.

9. The device of claim 1, wherein the charge storage film is a silicon nitride film.

10. The device of claim 1, wherein the tunnel insulating film has a composition ratio of $(SiO_2)_x(Si_3N_4)_{1-x}$ ($0.75 \leq x \leq 1$).

11. The device of claim 1, further comprising:
    a first insulating layer being provided on an inner side of the silicon pillar.

* * * * *